United States Patent
Stribley et al.

(10) Patent No.: US 9,947,662 B2
(45) Date of Patent: Apr. 17, 2018

(54) CMOS CIRCUITS SUITABLE FOR LOW NOISE RF APPLICATIONS

(75) Inventors: Paul Ronald Stribley, Plymouth (GB); John Nigel Ellis, Tavistock (GB)

(73) Assignee: X-FAB SEMICONDUCTOR FOUNDRIES AG, Erfurt (DE)

( * ) Notice: Subject to any disclaimer, the term of this patent is extended or adjusted under 35 U.S.C. 154(b) by 1544 days.

(21) Appl. No.: 12/306,935

(22) PCT Filed: Jun. 27, 2007

(86) PCT No.: PCT/GB2007/050362
§ 371 (c)(1),
(2), (4) Date: Feb. 9, 2009

(87) PCT Pub. No.: WO2008/001135
PCT Pub. Date: Jan. 3, 2008

(65) Prior Publication Data
US 2009/0315119 A1 Dec. 24, 2009

(30) Foreign Application Priority Data
Jun. 30, 2006 (GB) .................................. 0612921.7

(51) Int. Cl.
*H01L 21/02* (2006.01)
*H01L 27/092* (2006.01)

(52) U.S. Cl.
CPC ........ *H01L 27/092* (2013.01); *H01L 27/0928* (2013.01)

(58) Field of Classification Search
USPC ............................ 257/369, E27.046; 438/199
See application file for complete search history.

(56) References Cited

U.S. PATENT DOCUMENTS

| 4,918,333 | A | * | 4/1990 | Anderson et al. | 326/32 |
| 4,966,866 | A | | 10/1990 | Mikata et al. | |
| 5,907,767 | A | * | 5/1999 | Tohyama | 438/75 |
| 6,303,418 | B1 | * | 10/2001 | Cha et al. | 438/199 |
| 6,337,248 | B1 | * | 1/2002 | Imai | 438/279 |
| 6,917,095 | B1 | * | 7/2005 | Wong et al. | 257/548 |
| 2002/0151090 | A1 | | 10/2002 | Wong | |
| 2004/0124463 | A1 | | 7/2004 | Harada et al. | |
| 2004/0164354 | A1 | | 8/2004 | Mergens et al. | |

(Continued)

FOREIGN PATENT DOCUMENTS

| EP | 0822660 | 2/1998 |
| EP | 1291918 | 3/2003 |
| JP | 58-021857 | 2/1983 |

OTHER PUBLICATIONS

PCT, International Preliminary Report on Patentability, PCT/GB2007/050362 (6 pages) (dated Jan. 6, 2009).

(Continued)

*Primary Examiner* — Jesse Y Miyoshi
*Assistant Examiner* — John Lin
(74) *Attorney, Agent, or Firm* — Thompson Hine LLP

(57) ABSTRACT

A CMOS circuit comprises CMOS MOSFETs having n-type and p-type gates on the same substrate, wherein the substrate is divided into regions of n-type and p-type diffusions, and those diffusions are contained within a deeper n-type diffusion, used to junction isolate components within the deeper n-type diffusion from components outside of the deeper n-type diffusion.

12 Claims, 2 Drawing Sheets

(56) References Cited

U.S. PATENT DOCUMENTS

Figure 1:
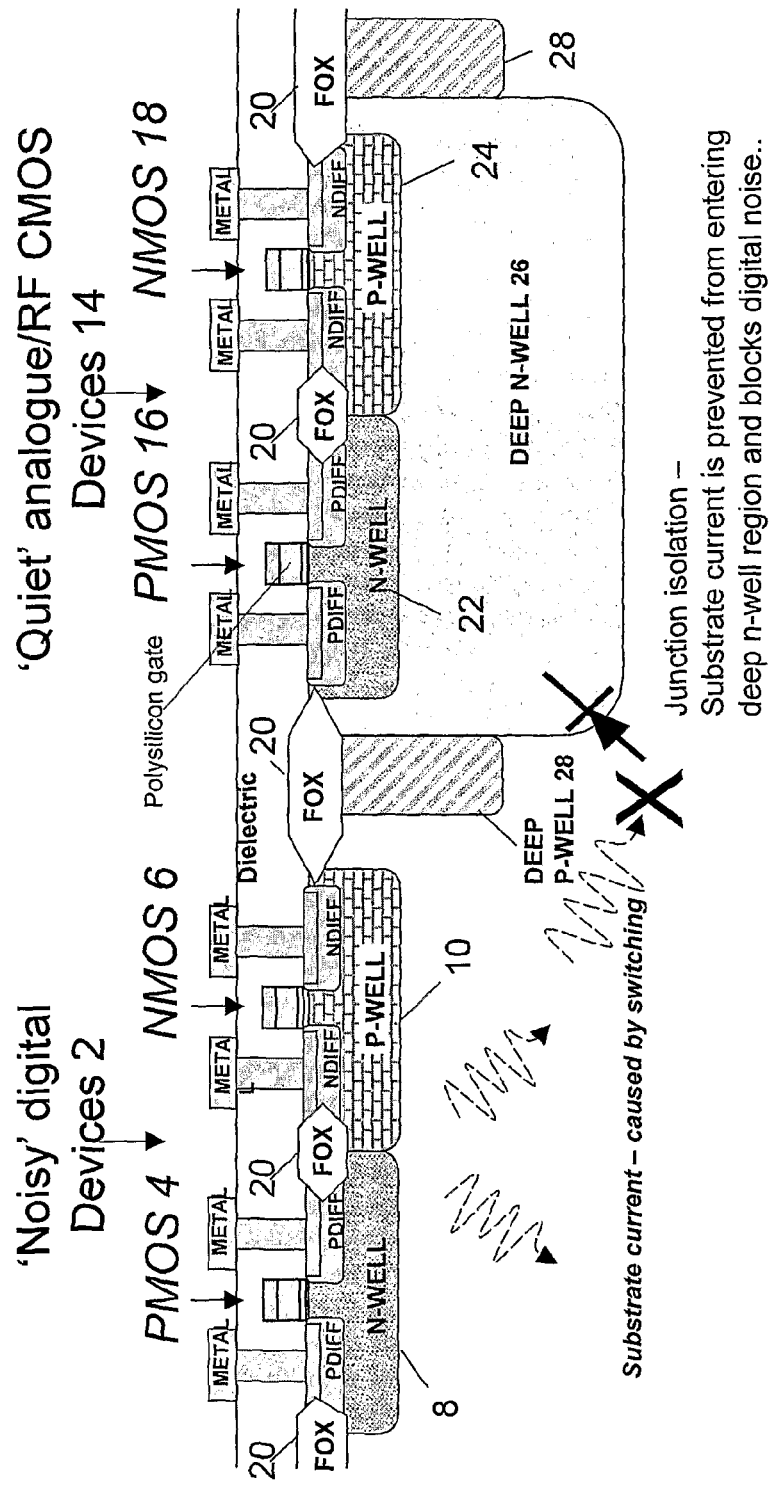

2004/0201065 A1 10/2004 Kar-Roy et al.
2004/0219733 A1 11/2004 Algotsson et al.
2006/0108599 A1 5/2006 Liou

OTHER PUBLICATIONS

PCT, International Search Report, PCT/GB2007/050362 (dated Aug. 24, 2007; published Jan. 3, 2008).
Examination Opinion, Application No. GB0612921.7 (1 page) (dated Nov. 13, 2006).
Search Report, Application No. GB0612921.7 (2 page) (dated Nov. 10, 2006).

* cited by examiner

CMOS CIRCUITS SUITABLE FOR LOW NOISE RF APPLICATIONS

The invention relates to CMOS circuits suitable for low noise RF applications.

RF CMOS designs are challenged with the requirement of high performance (switching speed) and this is often considered by designers at the expense of other important needs of a circuit. But any circuit eg. amplifier or oscillator also needs to have low intrinsic noise and also a high immunity against noise created from other nearby components which may interfere with the circuit function. The ability of a CMOS process solution to provide both high frequency capability and also low noise is advantageous in the realisation of many important circuits.

Issues relating to PMOS noise will now be discussed. High performance RF CMOS tends to be focussed on NMOS components because the mobility of electrons is superior to that of holes. Hence drive current and switching speed is better for NMOS compared to PMOS in the same CMOS process. However the NMOS device usually has a construction which makes the flicker noise (also known as 1/f noise because it increases at lower frequencies) which arises from the interaction of the conducting channel and the gate oxide Si—SiO2 interface larger. The conducting channel is positioned at the Si—SiO2 surface.

PMOS devices however have lower flicker noise. This is because the conducting channel is, in generally more deeply situated for the PMOS compared to the NMOS. In PMOS, with n-type polysilicon gate, an implantation of a boron threshold adjust implant in the surface counterdopes the n-well and pushes the conducting channel downwards into the silicon. The distance below the Si—SiO2 interface both assists the carrier mobility, since the mobility at the surface is lower due to surface traps and it also lowers the flicker noise by reducing the channel interaction with the interface. Such PMOS devices are termed buried channel devices. NMOS components are usually surface channel devices.

PMOS current flow is generally lower at the same bias compared to NMOS. The flicker noise is also dependent on the magnitude of the channel current. Thus the flicker noise for PMOS is less, because the mobility of holes is lower than electrons.

A high frequency capable PMOS component with buried channel structure is a solution to the problem of RF-CMOS circuits which also require low noise.

Very small sub-micron CMOS (less than $0.5 \times 10^{-6}$ m) is constructed with very thin gate dielectrics (less than 10 nm). The power supply voltage needs to be lowered in order to be compatible with the thin dielectric. If the voltage is not reduced the electric field in the gate dielectric becomes large enough to cause current conduction through the insulator and consequent degradation in the reliability of the transistor. However this reduction in supply voltage is only compatible with transistors which have threshold voltages which are lower in magnitude. Unfortunately PMOS threshold voltages on buried channel components cannot be lowered far enough without causing problems.

To solve this problem in many commercially available RF-CMOS processes the PMOS device structure is changed to a surface channel device.

PMOS formed with n-type gates must have significantly large surface p-type implants to offset the natural work-function difference of the gate metal to silicon body. However this also means that the surface doping needed to make devices with very low threshold voltage is excessive and tends to spoil the device electrical leakage behaviour.

By changing the doping type of the gate polysilicon from n-type to p-type the carrier work-function difference of the gate metal to the silicon body is reduced. This then makes it possible to lower the threshold voltage of the PMOS without causing excessive source to drain sub-threshold leakage. However the consequence of using a surface channel PMOS is that the flicker noise is increased compared to a buried channel device. The increase in flicker noise can be about 10 to 100 times and hence impacts the design of low noise circuits.

Issues relating to circuit block noise will now be discussed. Noise from one circuit may interfere with an adjacent one. For example the RF amplifier used for a radio design may have its operational signals disturbed by the electrical noise from a nearby digital logic circuit. Digital logic tends to be fairly tolerant to noise because the signals are switched rail to rail. But the digital circuitry tends to produce large pulses of current as the transistor gates are switched, and this means that they can produce significant disturbances to any sensitive analogue circuits which may be fabricated on the same integrated circuit. In an analogue circuit the designs tend to be created with precautions to minimise the noise contributions from circuits because this would otherwise degrade the signal.

The invention provides a CMOS circuit as set out in the accompanying claims.

Figure 2:
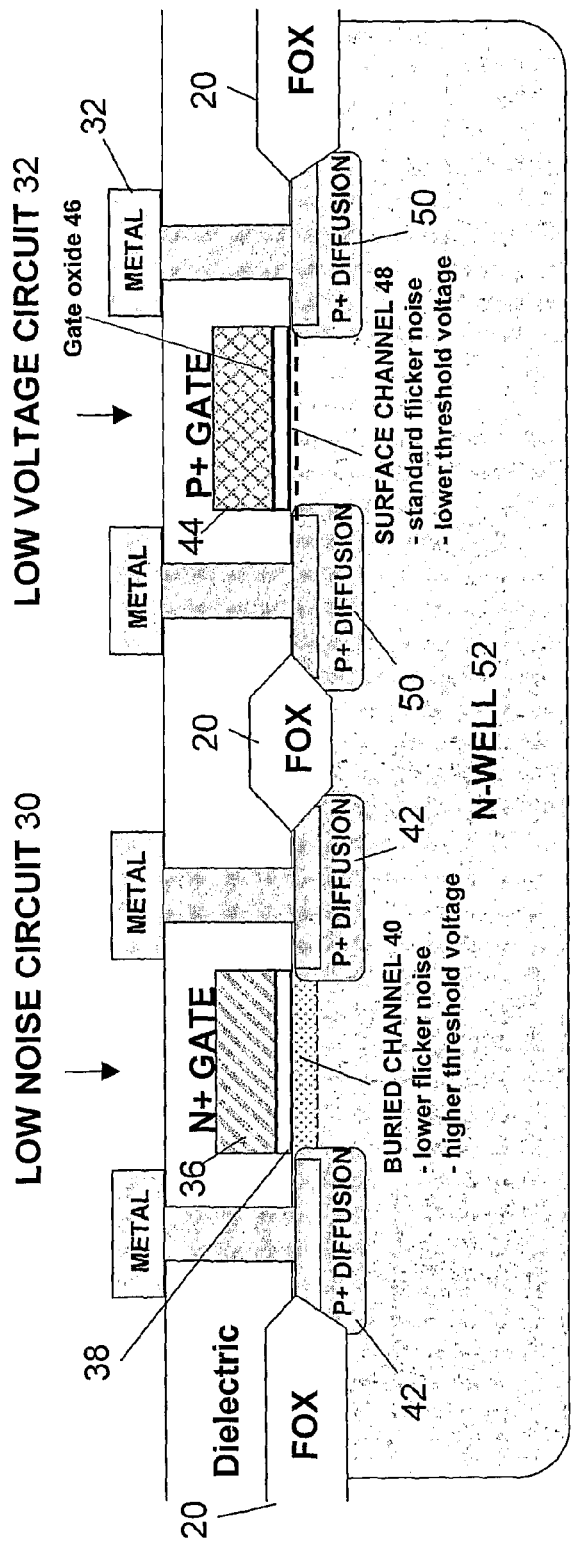

Embodiments of the invention will now be described, by way of example only, with reference to the accompanying drawings, in which:

FIG. 1 shows digital noise suppression using a deep n-well junction isolation method: and FIG. 2 shows two PMOS devices with different gate types formed on the same wafer, to integrate low noise and low voltage circuits.

FIG. 1 illustrates a noisy digital CMOS device 2 comprising a PMOS device 4 and an NMOS device 6, these devices having an n-type diffusion or n-well 8 and a p-type diffusion or p-well 10 formed in a semiconductor p-substrate 12. FIG. 1 also shows an RF CMOS device 14 comprising a PMOS device 16 and NMOS device 18. The devices are separated by regions of field oxide dielectric (for example silicon dioxide) 20. The PMOS 16 and NMOS 18 devices are provided with a shallow n-well 22 and a shallow p-well 24 respectively, and these shallow wells are contained within a deep n-well 26 formed in the substrate 12. The deep n-well 26 may be surrounded by a deep p-well 28, which may form a ring around the deep n-well 26 in order to electrically isolate the deep n-well 26.

FIG. 2 shows a buried channel PMOS device 30 and a surface channel PMOS device 32 formed on the same semiconductor p-substrate 34. These devices are contained within a deep n-well which is not shown in FIG. 2. The PMOS device 30 is provided with an N+ gate 36 provided on a gate oxide 38, which creates a relatively thick buried channel 40 between the P+ diffusion regions 42 of the MOSFET 30.

The PMOS device 32 is provided with a P+ gate 44 on a gate oxide 46 which creates a thin surface channel 48 which conducts between the P+ diffusion regions 50 only on the surface of the n-well 52 which surrounds the P+ diffusion regions 42 and 50.

Several features of the embodiments deal with the concerns of noise and the possible interactions of digital and RF-CMOS or analogue circuits within an integrated circuit.

There is provided a CMOS process which comprises both surface channel and buried channel components. The NMOS components are surface channel with n-type polysilicon gates. The PMOS components are either surface channel p-type polysilicon gate or buried channel n-type polysilicon gate. By selectively doping the polysilicon gate it is possible to create some regions which are n-type and some which are p-type. Both p-type and n-type gates can be created, as shown in FIG. 2. Hence it is possible to create low noise buried channel PMOS devices with other surface channel devices (NMOS and PMOS) on the same wafer.

The surface channel devices can be used for lower supply voltage digital blocks (eg 1.8V) because the threshold voltages can be made low enough in magnitude. Buried channel PMOS devices can be used for noise-sensitive circuits because they offer lower flicker noise compared to surface channel devices. Hence the combination of transistors in the manufacturing process offers the capability of integrating low noise circuits on the same chip as digital circuits without compromising either the noise or the digital supply voltage.

These components are fabricated on a relatively thick epitaxial p-substrate 12, 34 (e.g. 5 to $30 \times 10^{-6}$ m, preferably approximately $15 \times 10^{-6}$ m of low doped p-type epitaxy on a p-type substrate wafer). A deep $10 \times 10^{-6}$ m diffused n-well 26 with low doping is implanted and diffused into the p-epitaxy. Then the CMOS components are made with shallower n-wells and p-wells 8, 10, 22, 24 in order to contain the components within the deep n-well 26. Other CMOS devices made with the same shallow n-well and p-well regions can be fabricated on the same wafer in regions separated from the deep n-well regions.

The deep n-well 26 can be used to electrically shield components which are inside the n-well against possible perturbations of noise from those devices outside it. For example digital CMOS circuitry can be made outside the deep n-well region 26 and sensitive analogue circuits can be made inside the deep n-well 26. Then any noise contributions from the digital region cannot interfere with the signals of the analogue region because the diode junction between the regions prevents current flow and also the deep n-well 26 acts as an electrical potential (voltage) shield. Thus voltage or current spikes in the digital region are unable to penetrate into the analogue or RF circuit zone.

Also the ability to isolate circuits also allows the n-well 26 to be biased at high voltage with respect to ground. This is another advantage of this configuration. Digital or analogue circuits can be biased so that the output voltage switches at a higher voltage than would normally be possible from a normal CMOS chip.

The size of the CMOS technology is small enough (approximately $0.35 \times 10^{-6}$ m) for the devices to be used for RF-CMOS circuitry, eg for on-chip radio or wireless networking circuits working up to a few GHz. The frequency limit for such devices is usually between 10 GHz and 50 GHz. Hence high frequency signals of the order of a few GHz can be amplified and signal processed using special component layouts of the CMOS devices. These components can be fabricated within the deep n-well region 26 of the process wafer to ensure that the noise perturbations from other circuits is minimised. Thus the process offers the capability of isolated, noise shielded RF-CMOS devices manufactured on the same wafers as digital or analogue CMOS circuits.

The PMOS component may be created as a buried channel device and as such minimises the flicker noise. This component is available both inside the isolating deep n-well or outside, making it an ideal solution for isolating some low noise analogue or RF circuits from digital blocks. Conversely the digital blocks can also be made in separate deep n-wells to further isolate components from each other.

Low threshold voltage NMOS and PMOS components can also be made on the same chip because both transistors can be surface channel. This is advantageous, eg for digital circuitry operating below 2V where power consumption is less. Also the low threshold voltage allows greater drive current for other circuits at any given voltage.

A second gate dielectric layer (not shown) and optionally different n-well and p-well diffusions (not shown) can be created on the same integrated circuit so that higher voltage capable CMOS components can coexist with the lower voltage CMOS devices. The supply voltage can be significantly higher than the lower voltage CMOS (eg 5V or 18V) so that the semiconductor process is able to provide circuit solutions for many types of electronic systems. These higher voltage components may also be usable at RF frequencies. For example an RF circuit may require and antenna output driver which operates at around double the supply voltage level of the rest of the RF circuit.

Additional RF-CMOS compatible components may be added to the process such as polysilicon resistors, metal-insulator-metal capacitors and thick metal inductors. These components are used within RF-CMOS circuits, so that complete RF electronic systems can be integrated on the same chip.

This provides an RF capable CMOS process technology which has specific features which make it advantageous for the manufacture of noise sensitive analogue and mixed signal (analogue combined with digital) blocks. The embodiment provides the following features:

Buried channel PMOS devices which have low flicker noise compared to alternative devices to give a low noise advantage to circuits using them.

Surface channel NMOS devices which can have low threshold voltages to allow lower supply voltages for some circuits.

Surface channel PMOS devices which can have low magnitude threshold voltages to allow lower supply voltages for some circuits.

Surface channel PMOS devices integrated with surface channel NMOS and buried channel PMOS on the same integrated circuit.

All PMOS and NMOS devices can have high frequency performance (frequency limit of greater than about 10 GHz) suitable for RF signal circuits.

Isolating deep n-wells are manufactured in thick p-type epitaxial silicon on p-substrate. The isolating wells can be used for individual components or whole circuit blocks. The n-well is junction isolated from the common p-type substrate and also may be used to shield components electrically to avoid noise propagation from one circuit to another.

The deep n-well may be biased (by applying a voltage thereto) to achieve circuit operation at high voltage offset from ground.

CMOS components available both inside and outside the deep n-well. Isolated circuit blocks may be digital, or analogue or RF. Circuit blocks can be fully isolated from each other using the deep n-well.

CMOS devices with thicker gate dielectric can be manufactured on the same semiconductor wafers to allow higher voltages to be used for some circuits which can coexist on the same integrated circuit as the aforementioned lower voltage CMOS components—eg 3.3V CMOS and 18V CMOS on the same integrated circuit.

Additional polysilicon resistors, metal capacitors and inductors are also implemented on the RF-CMOS process to allow the fabrication of complete RF electronic circuits on the same integrated circuit.

The invention claimed is:

1. A CMOS circuit structure comprising a plurality of CMOS MOSFETs on a single substrate, wherein the substrate is divided into regions of n-type and p-type diffusions, and those diffusions are contained within a deeper n-type diffusion, used to junction isolate components within the deeper n-type diffusion from components outside of the deeper n-type diffusion, wherein the plurality of CMOS MOSFETs comprise at least one PMOS buried channel MOSFET contained within said deeper n-type diffusion and at least one PMOS surface channel MOSFET contained within said deeper n-type diffusion, and wherein the CMOS circuit structure further comprises a p-type diffusion surrounding the deeper n-type diffusion, and the p-type diffusion comprises a deep p-well.

2. A CMOS circuit structure as claimed in claim 1, wherein said deeper n-type diffusion is formed in a silicon substrate.

3. A CMOS circuit structure as claimed in claim 1, which comprises at least one surface channel NMOS device integrated within said substrate.

4. A CMOS circuit structure as claimed in claim 1, wherein the circuit structure is operable at at least about 10 GHz.

5. A CMOS circuit structure as claimed in claim 1, wherein said deeper n-type diffusion is formed in a p-type epitaxial silicon substrate which is at least $5\times10^{-6}$ m thick.

6. A CMOS circuit structure as claimed in claim 1, wherein said deeper n-type diffusion is biased to achieve circuit operation at a voltage of at least 3.3V offset from ground.

7. A CMOS circuit structure as claimed in claim 1, which comprises CMOS components both inside and outside of said deeper n-type diffusion.

8. A CMOS circuit structure as claimed in claim 1, wherein said substrate contains at least two MOSFETs having gate dielectrics of different thicknesses.

9. A CMOS circuit structure as claimed in claim 1, which further comprises resistors, metal capacitors and inductors formed on said substrate.

10. A CMOS circuit structure as claimed in claim 1, wherein the deeper n-type diffusion is lightly doped.

11. A CMOS circuit structure as claimed in claim 1, wherein the CMOS circuit is a RF-CMOS circuit.

12. A CMOS circuit structure comprising a plurality of CMOS MOSFETs on a single substrate, wherein the substrate is divided into regions of n-type and p-type diffusions, and those diffusions are contained within a deeper n-type diffusion, used to junction isolate components within the deeper n-type diffusion from components outside of the deeper n-type diffusion, wherein the plurality of CMOS MOSFETs comprise at least one PMOS buried channel MOSFET contained within said deeper n-type diffusion and at least one PMOS surface channel MOSFET contained within said deeper n-type diffusion, wherein the CMOS circuit structure further comprises a p-type diffusion surrounding the deeper n-type diffusion, and the p-type diffusion surrounding the deeper n-type diffusion is arranged to isolate the deeper n-type diffusion.

* * * * *